US012581683B2

(12) United States Patent
Hua et al.

(10) Patent No.: US 12,581,683 B2
(45) Date of Patent: Mar. 17, 2026

(54) P-TYPE GATE HEMT DEVICE

(71) Applicant: SOUTHERN UNIVERSITY OF SCIENCE AND TECHNOLOGY, Shenzhen (CN)

(72) Inventors: Mengyuan Hua, Shenzhen (CN); Junting Chen, Shenzhen (CN)

(73) Assignee: SOUTHERN UNIVERSITY OF SCIENCE AND TECHNOLOGY, Shenzhen (CN)

( * ) Notice: Subject to any disclaimer, the term of this patent is extended or adjusted under 35 U.S.C. 154(b) by 478 days.

(21) Appl. No.: 18/029,990

(22) PCT Filed: Aug. 18, 2021

(86) PCT No.: PCT/CN2021/113215
§ 371 (c)(1),
(2) Date: Apr. 3, 2023

(87) PCT Pub. No.: WO2022/127165
PCT Pub. Date: Jun. 23, 2022

(65) Prior Publication Data
US 2023/0411504 A1     Dec. 21, 2023

(30) Foreign Application Priority Data
Dec. 14, 2020    (CN) .......................... 202011463725.6

(51) Int. Cl.
H10D 30/47      (2025.01)
H10D 62/17      (2025.01)
H10D 62/85      (2025.01)

(52) U.S. Cl.
CPC ......... H10D 30/475 (2025.01); H10D 62/343 (2025.01); H10D 62/8503 (2025.01)

(58) Field of Classification Search
CPC .. H10D 30/015; H10D 30/471; H10D 30/472; H10D 30/473; H10D 30/4732;
(Continued)

(56) References Cited

U.S. PATENT DOCUMENTS

| | | | |
|---|---|---|---|
| 2014/0091310 A1* | 4/2014 | Jeon | ................... H10D 62/8503 438/172 |
| 2017/0018639 A1 | 1/2017 | Teo et al. | |

(Continued)

FOREIGN PATENT DOCUMENTS

| | | |
|---|---|---|
| CN | 103098221 A | 5/2013 |
| CN | 105070752 A | 11/2015 |

(Continued)

OTHER PUBLICATIONS

"Enhancement-Mode GaN p-Channel MOSFETs for Power Integration" in Proceedings of the 2020 32nd International Symposium on Power Semiconductor Devices and ICs (ISPSD) Sep. 13-18, 2020 by Zheyang Zheng, Wenjie Song, Li Zhang, Song Yang, Han Xu, Roy K.-Y. Wong, Jin Wei, and Kevin J. Chen, (Year: 2020).*

(Continued)

*Primary Examiner* — Eric A. Ward
(74) *Attorney, Agent, or Firm* — Myers Wolin, LLC

(57)         ABSTRACT

A P-type gate HEMT device includes a substrate, a buffer layer, a channel layer, and a barrier layer sequentially arranged from bottom to top. A first P-type material layer is arranged on the barrier layer. A first source and a first drain are respectively arranged on two sides of the first P-type material layer. A first conductive layer is arranged on the first P-type material layer. A second P-type material layer is connected to the first P-type material layer. A second conductive layer is connected to the second P-type material layer. A third conductive layer is connected to the second P-type material layer. The first P-type material layer, the first (Continued)

source, the first drain, and the first conductive layer form a normally-off N-channel transistor. The second P-type material layer, the second conductive layer, and the third conductive layer form a normally-on P-channel transistor.

9 Claims, 3 Drawing Sheets

(58) Field of Classification Search
CPC .......... H10D 30/4735; H10D 30/4738; H10D 30/474; H10D 30/475; H10D 30/4755; H10D 30/476; H10D 30/477; H10D 30/478
See application file for complete search history.

(56) References Cited

U.S. PATENT DOCUMENTS

| | | | |
|---|---|---|---|
| 2019/0067465 A1 | 2/2019 | Sizov | |
| 2019/0312106 A1 | 10/2019 | Blanchard et al. | |
| 2020/0373297 A1* | 11/2020 | Nidhi ...................... | H01L 24/17 |

FOREIGN PATENT DOCUMENTS

| | | |
|---|---|---|
| CN | 105280694 A | 1/2016 |
| CN | 106549050 A | 3/2017 |
| CN | 106783962 A | 5/2017 |
| CN | 107871738 A | 4/2018 |
| CN | 110212028 A | 9/2019 |
| CN | 111048471 A | 4/2020 |
| CN | 111223933 A | 6/2020 |
| CN | 111312815 A | 6/2020 |
| CN | 111370472 A | 7/2020 |
| CN | 111916449 A | 11/2020 |
| CN | 112670340 A | 4/2021 |

OTHER PUBLICATIONS

International Search Report and Written Opinion of the International Searching Authority issued by the China National Intellectual Property Administration for International Patent Application No. PCT/CN2021/113215, mailed on Nov. 24, 2021, with an English translation.
First Search Report issued by the China National Intellectual Property Administration for Chinese Patent Application No. 2020114637256, dated Apr. 27, 2022, with an English translation.
Huang et al., "Research on device physics for high performance GaN-based power electronics", China Science: Physics, Mechanics and Astronomy, Jul. 2016, pp. 107307-1-107307-13, vol. 46, No. 10., with English abstract.

* cited by examiner

P-TYPE GATE HEMT DEVICE

CROSS-REFERENCE TO RELATED APPLICATIONS

This application is a National Stage under 35 U.S.C. § 371 of International Application Number PCT/CN2021/113215, filed on Aug. 18, 2021, and which designated the U.S., which claims priority to Chinese Patent Application No. 202011463725.6, filed on Dec. 14, 2020. The contents of each are incorporated herein by reference in their entirety.

TECHNICAL FIELD

The disclosure relates to the technical field of transistors, and particularly to a P-type gate HEMT device.

BACKGROUND

Gallium nitride (GaN) has excellent material characteristic advantages, such as wide band gap (3.4 eV), high breakdown electric field, high electron saturation velocity, and high electron mobility. Because of these material characteristics, a power electronic device based on the GaN has better performances than a traditional silicon device, comprising advantages, such as higher operating temperatures, higher switching frequency, and lower energy loss. A common GaN-based power electronic device is a high electron mobility transistor (HEMT). Because of the polarization induced by an aluminum gallium nitride (AlGaN) barrier layer, a layer of high-concentration two-dimensional electron gas is formed at an interface between AlGaN and GaN. This layer of two-dimensional electron gas, as a channel, can realize a low on-resistance characteristic of a GaN-based device, but leads to a normally-on state of the GaN-based device. Due to the demands for fail safe design and simplified driving circuit design, the demand for a normally-off device in circuit application is more urgent.

Methods for realizing a normally-off GaN HEMT in the related art comprises: injecting fluoride ions, connecting to a normally-off silicon-based device in a cascode manner, introducing a P-type GaN or AlGaN cap layer, thinning an AlGaN barrier layer in a gate region, etc. The practice of introducing the P-type GaN or AlGaN cap layer into the gate region to deplete two-dimensional electron gas has been applied in industry, but a threshold voltage of the P-type gate GaN HEMT obtained is generally less than 2 V, which puts strict requirements on the driving circuit. Due to gate voltage oscillation caused by parasitic parameters during high-speed switching, a gate voltage easily exceeds the threshold voltage, thus causing false turn-on. At present, the driving circuit of the P-type gate GaN HEMT often needs to be provided with a negative gate voltage to completely turn off the device, which greatly increases the complexity of the driving circuit and reduces the system reliability. In addition, the charge balance of a P-GaN layer in the P-type gate GaN HEMT is easily broken, leading to hole surplus or deficiency. Since the P-GaN layer is not electrically connected to any terminal directly, it is difficult to recover the charge balance quickly, which leads to the drift of the threshold voltage.

SUMMARY

The disclosure aims at solving at least one of the technical problems in the prior art. Therefore, the disclosure provides a P-type gate HEMT device, which can increase a threshold voltage and a regulation range thereof, and eliminate threshold drift caused by a change of a total amount of charges in a P-type gate material layer.

A P-type gate HEMT device according to an embodiment in a first aspect of the disclosure comprises: a substrate, a buffer layer, a channel layer, and a barrier layer which are sequentially arranged from bottom to top; a first P-type material layer, wherein the first P-type material layer is arranged on the barrier layer, and a first source and a first drain are respectively arranged on two sides of the first P-type material layer; a first conductive layer, wherein the first conductive layer is arranged on the first P-type material layer; a second P-type material layer, wherein the second P-type material layer is connected to the first P-type material layer; a second conductive layer, wherein the second conductive layer is connected to the second P-type material layer; and a third conductive layer, wherein the third conductive layer is connected to the second P-type material layer; the first P-type material layer, the first source, the first drain, and the first conductive layer are used to form a normally-off N-channel transistor; and the second P-type material layer, the second conductive layer, and the third conductive layer are used to form a normally-on P-channel transistor.

The P-type gate HEMT device according to an embodiment of the disclosure has at least the following beneficial effects. By arranging the normally-on P-channel transistor on the basis of the GaN HEMT, a threshold voltage and a regulation range thereof can be increased, and threshold drift, caused by a change of a total amount of equivalent charges in the P-type material layer in a gate region of the original P-type gate GaN HEMT, can be eliminated.

According to some embodiments of the disclosure, the second conductive layer is connected to the first conductive layer.

According to some embodiments of the disclosure, one end of the third conductive layer is connected to the second P-type material layer, and the other end of the third conductive layer is connected to the first source.

According to some embodiments of the disclosure, the P-type gate HEMT device further comprises an N-type material layer, wherein one end of the N-type material layer is connected to the third conductive layer, and the other end of the N-type material layer is connected to the second P-type material layer.

According to some embodiments of the disclosure, a trench is arranged on the second P-type material layer, and the second conductive layer is arranged in the trench.

According to some embodiments of the disclosure, the P-type gate HEMT device further comprises a dielectric layer, wherein one end of the dielectric layer is connected to the second P-type material layer, the other end of the dielectric layer is connected to the second conductive layer, and the dielectric layer is made of a material comprising at least one of aluminum oxide, silicon oxide, silicon nitride, aluminum nitride, gallium oxynitride, aluminum oxynitride, silicon oxynitride, hafnium oxide, or yttrium oxide.

According to some embodiments of the disclosure, the first conductive layer is made of a metal material, and configured for forming Schottky contact with the first P-type material layer.

According to some embodiments of the disclosure, the second P-type material layer is connected to the barrier layer.

According to some embodiments of the disclosure, the first P-type material layer and the second P-type material layer are made of a same material, and the first P-type material layer is made of a material comprising at least one of gallium nitride, aluminum nitride, aluminum gallium nitride, or indium gallium nitride.

According to some embodiments of the disclosure, the barrier layer is made of a material comprising at least one of gallium nitride, aluminum nitride, or aluminum gallium nitride.

Additional aspects and advantages of the disclosure will be given in part in the following description, which will become apparent from the following description or be understood through practice of the disclosure.

BRIEF DESCRIPTION OF THE DRAWINGS

The disclosure will be further explained with reference to the accompanying drawings and embodiments hereinafter, wherein.

Figure 1:
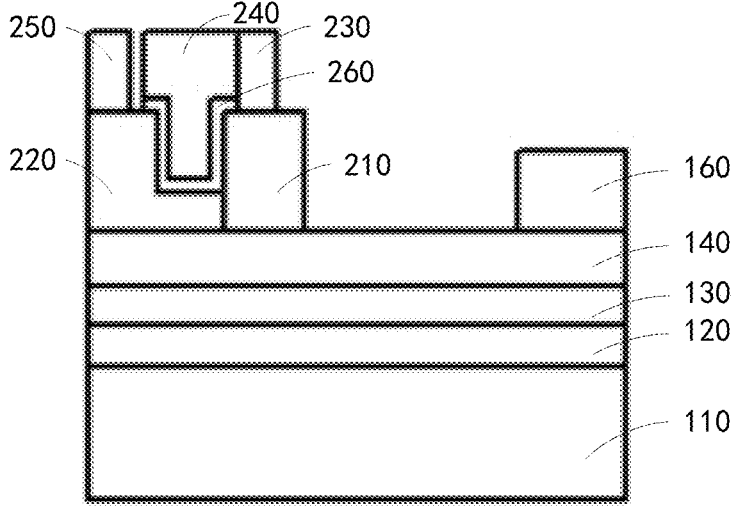
FIG. 1 is a front view of a P-type gate HEMT device according to an embodiment of the disclosure.

REFERENCE NUMERALS 110 refers to substrate, 120 refers to buffer layer, 130 refers to channel layer, 140 refers to barrier layer, 150 refers to first source, and 160 refers to first drain;

210 refers to first P-type material layer, 220 refers to second P-type material layer, and 230 refers to first conductive layer;

240 refers to second conductive layer, 250 refers to third conductive layer, and 260 refers to dielectric layer; and 310 refers to diode, 320 refers to P-channel transistor, and 330 refers to GaN HEMT.

DETAILED DESCRIPTION

Embodiments of the disclosure are described in detail hereinafter, examples of the embodiments are shown in the drawings, and the same or similar reference numerals throughout the drawings denote the same or similar elements or elements having the same or similar functions. The embodiments described hereinafter with reference to the drawings are exemplary, are only intended to explain the disclosure, and cannot be understood as limiting the disclosure.

In the description of the disclosure, it should be understood that, the orientation or position relationship related to the orientation description, such as the orientation or position relationship indicated by the terms "upper", "lower", "front", "rear", "left", "right", and the like is based on the orientation or position relationship shown in the drawings, which is only used for convenience of the description of the disclosure and simplification of the description instead of indicating or implying that the indicated device or element must have a specific orientation, and be constructed and operated in a specific orientation, and thus should not be understood as a limitation to the disclosure.

In the description of the disclosure, the term "several" refers to being one or more, the term "multiple" refers to being two or more, and the terms "greater than", "less than", "more than" and the like are understood as not including the following number, while the terms "above", "below", "within" and the like are understood as including the following number. If there is the description of first and second, it is only for the purpose of distinguishing between technical features, and should not be understood as indicating or implying relative importance, implicitly indicating the number of the indicated technical features or implicitly indicating the order of the indicated technical features.

In the description of the disclosure, unless otherwise explicitly defined, the terms "set", "mount" and "connect" should be understood in a broad sense, and those of ordinary skills in the art can reasonably determine the specific meanings of the above terms in the disclosure in combination with the specific contents of the technical solution.

Figure 2:
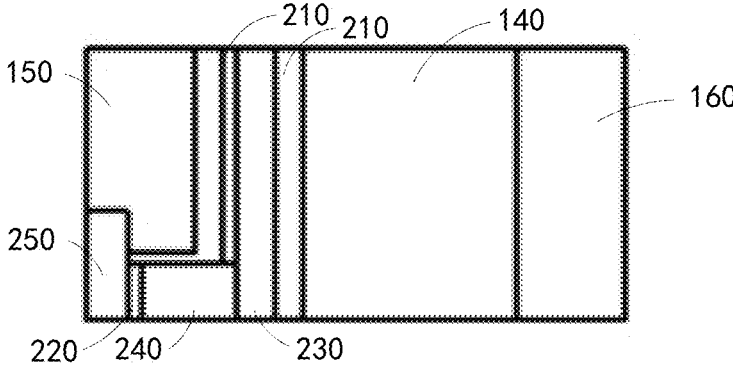
FIG. 2 is a top view of the P-type gate HEMT device according to an embodiment of the disclosure.
Figure 3:
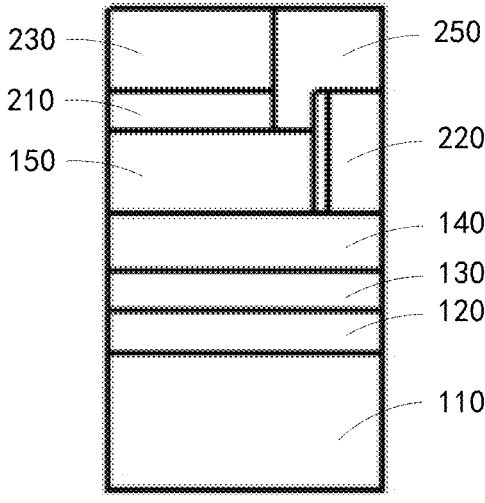
FIG. 3 is a left view of the P-type gate HEMT device according to an embodiment of the disclosure.

Some embodiments of the disclosure provide a P-type gate HEMT device, referring to FIG. 1 to FIG. 3, comprising: a substrate 110, a buffer layer 120, a channel layer 130, and a barrier layer 140 which are sequentially arranged from bottom to top; a first P-type material layer 210, wherein the first P-type material layer 210 is arranged on the barrier layer 140, and a first source 150 and a first drain 160 are respectively arranged on two sides of the first P-type material layer 210; a first conductive layer 230, wherein the first conductive layer 230 is arranged on the first P-type material layer 210; a second P-type material layer 220, wherein the second P-type material layer 220 is connected to the first P-type material layer 210; a second conductive layer 240, wherein the second conductive layer 240 is connected to the second P-type material layer 220; and a third conductive layer 250, wherein the third conductive layer 250 is connected to the second P-type material layer 220. The first P-type material layer 210, the first source 150, the first drain 160, and the first conductive layer 230 are used to form a normally-off N-channel transistor. The second P-type material layer 220, the second conductive layer 240, and the third conductive layer 250 are used to form a normally-on P-channel transistor.

Figure 4:
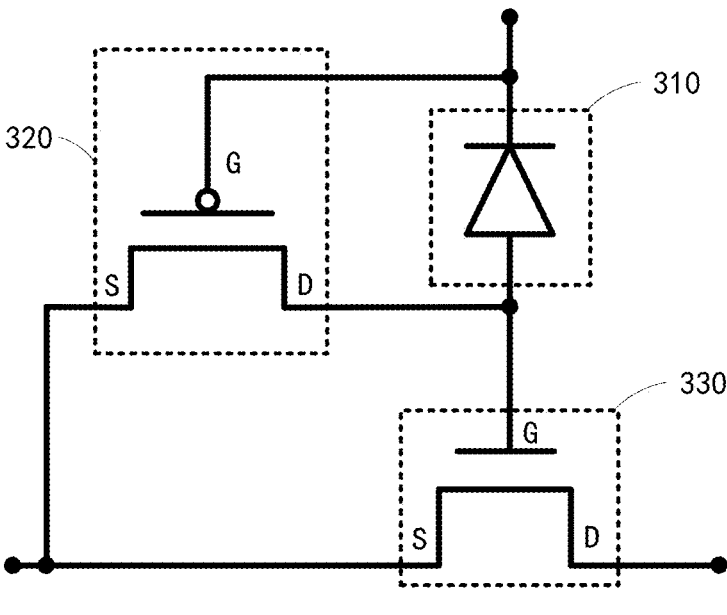
FIG. 4 is an equivalent circuit diagram of the P-type gate HEMT device according to an embodiment of the disclosure.

Refer to FIG. 4, which is an equivalent circuit diagram of the P-type gate HEMT device according to an embodiment of the disclosure, wherein the GaN HEMT 330 is formed by the first P-type material layer 210, the first source 150 and the first drain 160 arranged on the barrier layer 140. The diode 310 is the contact surface formed by arranging the first conductive layer 230 on the first P-type material layer 210, and has a unilateral conductivity, wherein the first conductive layer 230 is namely a cathode of the diode 310, and the first P-type material layer 210 is an anode of the diode 310. The P-channel transistor 320 is formed by the second conductive layer 240, the second P-type material layer 220 and the third conductive layer 250, the second conductive layer 240 is a gate of the P-channel transistor 320, the third conductive layer 250 is a source of the P-channel transistor 320, and a drain of the P-channel transistor 320 is located at an interface between the second P-type material layer 220 and the first P-type material layer 210. The source and the drain of the P-channel transistor 320 may be interchanged, and the contact area and doping concentration thereof may be changed according to device design requirements. By setting the material and doping concentration, the P-channel transistor 320 can be provided as a normally-on P-channel transistor, for example, may be a normally-on GaN transistor or a normally-on silicon-based transistor. In optional practical use, the cathode of the diode 310 needs to be electrically connected to the gate of the P-channel transistor 320, the anode of diode 310 needs to be electrically connected to the drain of the P-channel transistor 320, and the source of the P-channel transistor 320 needs to be connected to a source of the GaN HEMT 330. The specific connection mode may be selected according to actual needs. For example, the same technical effect can be achieved by means of connection through a respective bond wire in a wire bonding process during packaging, or by means of electrically connection under the action of external circuits by pulling out pins during packaging.

For example, a material of the substrate 110 of the P-type gate HEMT device may be silicon, silicon carbide, sapphire or other substrate materials that can epitaxially grow gallium nitride, and materials of the first source 150 and the first drain 160 may be conductive materials with low resistivity, such as titanium, aluminum, gold, nickel, tungsten, titanium nitride and the like, or may be any combination of these materials. A material of the second conductive layer 240 may be one or more of titanium, nickel, gold, and the like. Materials of the buffer layer 120, the channel layer 130 and the barrier layer 140 may be one or more of gallium nitride, aluminum nitride and aluminum gallium nitride.

By arranging the P-channel transistor 320 on the basis of the GaN HEMT 330, the problem of low threshold voltage of the P-type gate GaN HEMT in the prior art can be solved, and the technical effect of freely adjusting the threshold voltage in a large range can be achieved, that is, the threshold voltage and the regulation range thereof can be increased, and threshold drift, caused by a change of a total amount of equivalent charges in the P-type material layer in a gate region of the original P-type gate GaN HEMT can be eliminated, and the sub-threshold swing of the original P-type gate GaN HEMT will not be obviously affected.

Figure 5:
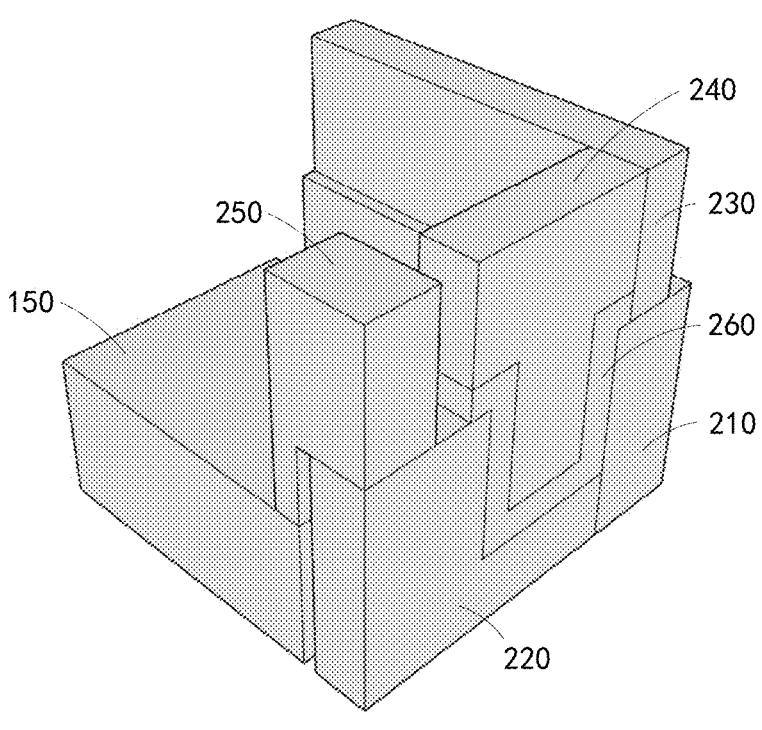
FIG. 5 is a partial three-dimensional diagram of the P-type gate HEMT device according to an embodiment of the disclosure.

In some embodiments, referring to FIG. 5, which is a partial three-dimensional diagram of the P-type gate HEMT device, the second conductive layer 240 is connected to the first conductive layer 230. That is, the cathode of the diode 310 is electrically connected to the gate of the P-channel transistor 320, and both the second conductive layer 240 and the first conductive layer 230 are made of conductive materials with low resistivity, so that the second conductive layer 240 and the first conductive layer 230 are connected at a chip structure level, which improves the reliability and stability of the electrical connection between the second conductive layer 240 and the first conductive layer 230.

In some embodiments, one end of the third conductive layer 250 is connected to the second P-type material layer 220, and the other end of the third conductive layer 250 is connected to the first source 150. That is, the source of the P-channel transistor 320 is connected to the source of the GaN HEMT 330, and the third conductive layer 250 is made of a conductive material with low resistivity, so that the third conductive layer 250 is connected at a chip structure level, which improves the reliability and stability of the electrical connection of the third conductive layer 250.

In some embodiments, an N-type material layer is further comprised, wherein one end of the N-type material layer is connected to the third conductive layer 250, and the other end of the N-type material layer is connected to the second P-type material layer 220. The third conductive layer 250 may be made of a material comprising one or more of nickel, copper, osmium, palladium, platinum, iridium, gold, and the like. By adding the N-type material layer between the third conductive layer 250 and the second P-type material layer 220, the contact resistance between the third conductive layer 250 and the second P-type material layer 220 is reduced. In some other embodiments, a material layer such as a plasma treatment layer can also be provided to reduce the contact resistance, so as to reduce the contact resistance during contact and optimize the device performance.

Figure 6:
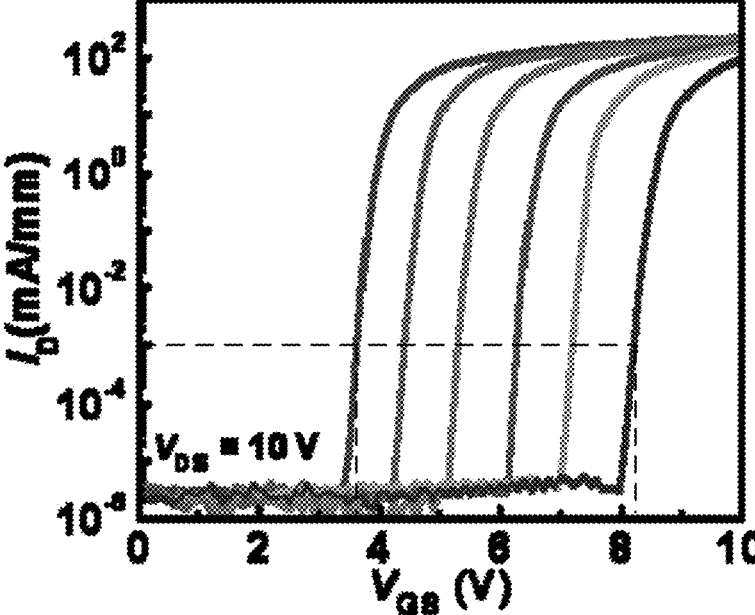
FIG. 6 is a transfer characteristic curve graph of different trench depths of the P-type gate HEMT device according to an embodiment of the disclosure.

In some embodiments, a trench is arranged on the second P-type material layer 220, and the second conductive layer 240 is arranged in the trench. By setting a depth and a specific shape of the trench, the threshold voltage of the P-type gate HEMT device can be changed, so that P-type gate HEMT devices with different threshold voltages can be manufactured to meet different requirements. For example, referring to FIG. 6, which is a transfer characteristic curve graph of different trench depths, by adjusting the trench depth, the P-type gate HEMT device of the disclosure can realize the adjustment of different threshold voltages from 3.6V to 8.2V.

In some embodiments, a dielectric layer 260 is further comprised, wherein one end of the dielectric layer 260 is connected to the second P-type material layer 220, the other end of the dielectric layer 260 is connected to the second conductive layer 240, and the dielectric layer 260 may be made of a material comprising at least one of aluminum oxide, silicon oxide, silicon nitride, aluminum nitride, gallium oxynitride, aluminum oxynitride, silicon oxynitride, hafnium oxide, or yttrium oxide. These oxides, nitrides, and nitrogen oxides all have insulating functions of preventing diffusion and current from flowing, and when in use, only one of these oxides, nitrides, and nitrogen oxides may be used, or a mixture of these oxides, nitrides, and nitrogen oxides may be used. By adding the insulating dielectric layer, the leakage of the device can be prevented. In some other embodiments, the dielectric layer may also be omitted.

In some other embodiments, the first conductive layer 230 is made of a metal material, and configured for forming Schottky contact with the first P-type material layer 210. Schottky contact is formed between the first conductive layer 230 and the first P-type material layer 210 to form a Schottky junction, which is the diode 310 in the equivalent circuit. In some other embodiments, a further dielectric layer may also be formed on the contact surface to form a PN junction, or a diode structure with unilateral conductivity formed by other structures may also be provided.

In some embodiments, the second P-type material layer 220 is connected to the barrier layer 140. A heterojunction contact is formed between the second P-type material layer 220 and the barrier layer 140, and the threshold voltage of the P-type gate HEMT can also be changed by changing a size of the second P-type material layer relative to the first P-type material layer. In some other embodiments, the barrier layer 140 may also be omitted. That is, the second P-type material layer 220 is not connected to the barrier layer 140, or a thickness of the barrier layer 140 connected to the second P-type material layer 220 is changed, which can affect the threshold voltage of the device.

In some embodiments, the first P-type material layer 210 and the second P-type material layer 220 are made of a same material, and the first P-type material layer 210 may be made of a material comprising at least one of gallium nitride, aluminum nitride, aluminum gallium nitride, or indium gallium nitride. The first P-type material layer 210 and the second P-type material layer 220 are made of the same material, which is convenient for process manufacturing. The gallium nitride, the aluminum nitride, the aluminum gallium nitride, and the indium gallium nitride are all P-type doped P-type material layers.

In some embodiments, the barrier layer 140 may be made of a material comprising at least one of gallium nitride, aluminum nitride or aluminum gallium nitride.

In the description of the disclosure, description with reference to the terms "some embodiments", "example" and the like means that specific features, structures, materials or characteristics described in connection with this embodiment or example are included in at least one embodiment or example of the disclosure. In the specification, the schematic representation of the above terms does not necessarily mean the same embodiment or example. Moreover, the specific features, structures, materials or characteristics described may be combined in any one or more embodiments or examples in a suitable manner.

The embodiments of the disclosure are described in detail with reference to the drawings above, but the disclosure is not limited to the above embodiments, and various changes may also be made within the knowledge scope of those of ordinary skills in the art without departing from the purpose of the disclosure. In addition, in case of no conflict, the embodiments in the disclosure and the features in the embodiments may be combined with each other.

What is claimed is:

1. A P-type gate HEMT device, comprising:
a substrate, a buffer layer, a channel layer, and a barrier layer which are sequentially arranged from bottom to top;
a first P-type material layer, wherein the first P-type material layer is arranged on the barrier layer, and a first source and a first drain are respectively arranged on two sides of the first P-type material layer;
a first conductive layer, wherein the first conductive layer is arranged on the first P-type material layer;
a second P-type material layer, wherein the second P-type material layer is connected to the first P-type material layer;
a second conductive layer, wherein the second conductive layer is connected to the second P-type material layer; and
a third conductive layer, wherein the third conductive layer is connected to the second P-type material layer;
wherein the first P-type material layer, the first source, the first drain, and the first conductive layer are used to form a normally-off N-channel transistor;
wherein the second P-type material layer, the second conductive layer, and the third conductive layer are used to form a normally-on P-channel transistor; and
wherein the third conductive layer is connected to the second P-type material layer, and the third conductive layer is connected to the first source.

2. The P-type gate HEMT device of claim 1, wherein the second conductive layer is connected to the first conductive layer.

3. The P-type gate HEMT device of claim 1, further comprising an N-type material layer, wherein one end of the N-type material layer is connected to the third conductive layer, and the other end of the N-type material layer is connected to the second P-type material layer.

4. The P-type gate HEMT device of claim 1, wherein a trench is arranged on the second P-type material layer, and the second conductive layer is arranged in the trench.

5. The P-type gate HEMT device of claim 1, wherein the second P-type material layer is connected to the barrier layer.

6. The P-type gate HEMT device of claim 1, wherein the first P-type material layer and the second P-type material layer are made of a same material, and the first P-type material layer is made of a material comprising at least one of gallium nitride, aluminum nitride, aluminum gallium nitride, or indium gallium nitride.

7. The P-type gate HEMT device of claim 1, wherein the barrier layer is made of a material comprising at least one of gallium nitride, aluminum nitride, or aluminum gallium nitride.

8. A P-type gate HEMT device, comprising:
a substrate, a buffer layer, a channel layer, and a barrier layer which are sequentially arranged from bottom to top;
a first P-type material layer, wherein the first P-type material layer is arranged on the barrier layer, and a first source and a first drain are respectively arranged on two sides of the first P-type material layer;
a first conductive layer, wherein the first conductive layer is arranged on the first P-type material layer;
a second P-type material layer, wherein the second P-type material layer is connected to the first P-type material layer;
a second conductive layer, wherein the second conductive layer is connected to the second P-type material layer; and
a third conductive layer, wherein the third conductive layer is connected to the second P-type material layer;
wherein the first P-type material layer, the first source, the first drain, and the first conductive layer are used to form a normally-off N-channel transistor; and
wherein the second P-type material layer, the second conductive layer, and the third conductive layer are used to form a normally-on P-channel transistor,
the device further comprising a dielectric layer, wherein one end of the dielectric layer is connected to the second P-type material layer, the other end of the dielectric layer is connected to the second conductive layer, and the dielectric layer is made of a material comprising at least one of aluminum oxide, silicon oxide, silicon nitride, aluminum nitride, gallium oxynitride, aluminum oxynitride, silicon oxynitride, hafnium oxide, or yttrium oxide.

9. A P-type gate HEMT device, comprising:
a substrate, a buffer layer, a channel layer, and a barrier layer which are sequentially arranged from bottom to top;
a first P-type material layer, wherein the first P-type material layer is arranged on the barrier layer, and a first source and a first drain are respectively arranged on two sides of the first P-type material layer;
a first conductive layer, wherein the first conductive layer is arranged on the first P-type material layer;
a second P-type material layer, wherein the second P-type material layer is connected to the first P-type material layer;
a second conductive layer, wherein the second conductive layer is connected to the second P-type material layer; and
a third conductive layer, wherein the third conductive layer is connected to the second P-type material layer;
wherein the first P-type material layer, the first source, the first drain, and the first conductive layer are used to form a normally-off N-channel transistor;
wherein the second P-type material layer, the second conductive layer, and the third conductive layer are used to form a normally-on P-channel transistor; and wherein the first conductive layer is made of a metal material, and configured for forming Schottky contact with the first P-type material layer.

* * * * *